(12) United States Patent
Su et al.

(10) Patent No.: US 9,468,099 B2
(45) Date of Patent: Oct. 11, 2016

(54) CONTACT PAD CONNECTION STRUCTURE FOR CONNECTING CONDUCTOR ASSEMBLY AND FLEXIBLE CIRCUIT BOARD

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Zhongli (TW)

( * ) Notice: Subject to any disclaimer, the term of this patent is extended or adjusted under 35 U.S.C. 154(b) by 0 days.

(21) Appl. No.: 14/731,709

(22) Filed: Jun. 5, 2015

(65) Prior Publication Data
US 2016/0234937 A1 Aug. 11, 2016

(30) Foreign Application Priority Data
Feb. 6, 2015 (TW) .............................. 104103992 A (51) Int. Cl.
*H05K 1/11* (2006.01)
(52) U.S. Cl.
CPC ..................... *H05K 1/111* (2013.01)
(58) Field of Classification Search
None
See application file for complete search history.

(56) References Cited

U.S. PATENT DOCUMENTS

| 7,510,425 | B2 * | 3/2009 | Kuo | H05K 3/3405 439/493 |
| 2005/0202693 | A1 * | 9/2005 | Kuo | G02F 1/13452 439/67 |
| 2009/0104813 | A1 * | 4/2009 | Chen | H01R 9/038 439/581 |
| 2011/0028017 | A1 * | 2/2011 | Chuo | H05K 1/0218 439/329 |

OTHER PUBLICATIONS

3M_Cable_Selection_Guide_2012_0 dated Jun. 30, 2012.*

* cited by examiner

*Primary Examiner* — Michael F McAllister
(74) *Attorney, Agent, or Firm* — Rosenberg, Klein & Lee (57) ABSTRACT

Disclosed is contact pad connection structure for connecting a conductor assembly and a flexible circuit board. A substrate has a top surface on which a plurality of elevation pads are formed and respectively located in spacing zones between contact pads. Each of the elevation pads has a height above a top contact surface of the contact pads. The conductor assembly has exposed conductors that are respectively set in contact with the top contact surfaces of the contact pads and a solder material is applied to solder and fix the exposed conductors respectively in position on the top contact surfaces of the contact pads. Each of the elevation pads includes an extension section extended in a direction toward a front edge of the substrate.

14 Claims, 8 Drawing Sheets

CONTACT PAD CONNECTION STRUCTURE FOR CONNECTING CONDUCTOR ASSEMBLY AND FLEXIBLE CIRCUIT BOARD

BACKGROUND OF THE INVENTION

1. Field of the Invention

The present invention relates to a connection structure of a conductor assembly and a flexible circuit board, and in particular to a contact pad connection structure for connecting the conductor assembly and a flexible circuit board.

2. The Related Arts

Flexible circuit boards have been widely used in electronic products, especially those electronic products that are light and compact. For example, consumer electronic products, including mobile phones, digital cameras, computer peripherals, flat displays, and game machines, all involve the use of flexible circuit boards.

In applications of the flexible circuit boards in electronic devices, it is often that a flexible circuit board needs to be connected to a conductor assembly. A commonly adopted solution is to provide a plug to achieve a purpose of connection through insertion. However, with the trend of being light, thin, and compact for electronic devices, widths of signal lines of the flexible circuit boards are increasingly reduced, making it getting more and more difficult to connect a flexible circuit board with a conductor assembly.

For example, it is commonly a troublesome job in the industry to orderly arrange multiple conductor lines that are bundled together and then have them correctly inserted corresponding contact pads on a flexible circuit board. In the state of the art, it is still very often to carry out a series of operations, including separating, inserting, correcting, and soldering the conductor lines manually or partially manually by operators. Such a commonly adopted prior art process consumes human labor and may cause quality deviation of the operations of separating, inserting, correcting, and soldering the conductor lines due to the differences in respect of skill level and cautiousness.

It is thus a challenge of the industry to provide a solution to overcome the above problems.

SUMMARY OF THE INVENTION

Thus, to overcome the above problems, an object of the present invention is to provide a contact pad connection structure of a conductor assembly and a flexible circuit board, which, in a soldering and connection operation between the conductor assembly and the flexible circuit board, before soldering being made, allows exposed conductors of the conductor assembly to be guided and correctly inserted into and disposed on contact pads of the flexible circuit board by the design according to the present invention and then soldering can be carried out with a solder material.

The technical solution that the present invention adopts to achieve the above object is that a plurality of elevation pads is arranged on atop surface of a substrate in such a way that the elevation pads are respectively located in spacing zones defined between contact pads on the substrate and the elevation pads have a height above top contact surfaces of the contact pads. The conductor assembly comprises exposed conductors that are respectively set in contact with the contact pads in a one-to-one manner and then, a solder material is applied to solder and fix the exposed conductors respectively in position on the top contact surfaces of the contact pads. The elevation pads may be extended in a direction toward a front edge of the substrate to each form an extension section.

The efficacy is that to connect the conductor assembly and the flexible circuit board to each other, in an insertion operation of each of the exposed conductors, the arrangement of the elevation pads according to the present invention provides a function of correcting the direction of and guiding in the exposed conductors and also helping prevent the exposed conductors from contacting each other.

Further, the height of the elevation pads is made less than a diameter of the exposed conductors, so that in a process where heating is applied, the heat can be directly transmitted to the solder material and the exposed conductors so as to ensure an excellent quality of soldering between the exposed conductors and the contact pads.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
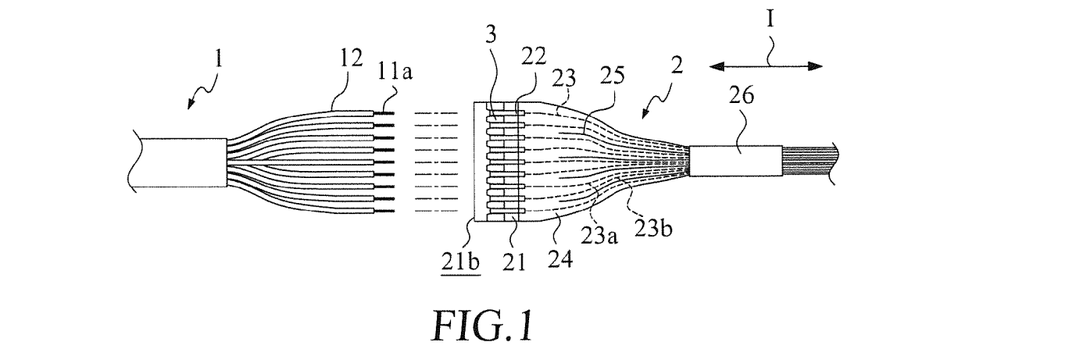
FIG. 1 is a schematic plan view showing a conductor assembly and a flexible circuit board of a first embodiment of the present invention in a condition of being not connected.
Figure 2:
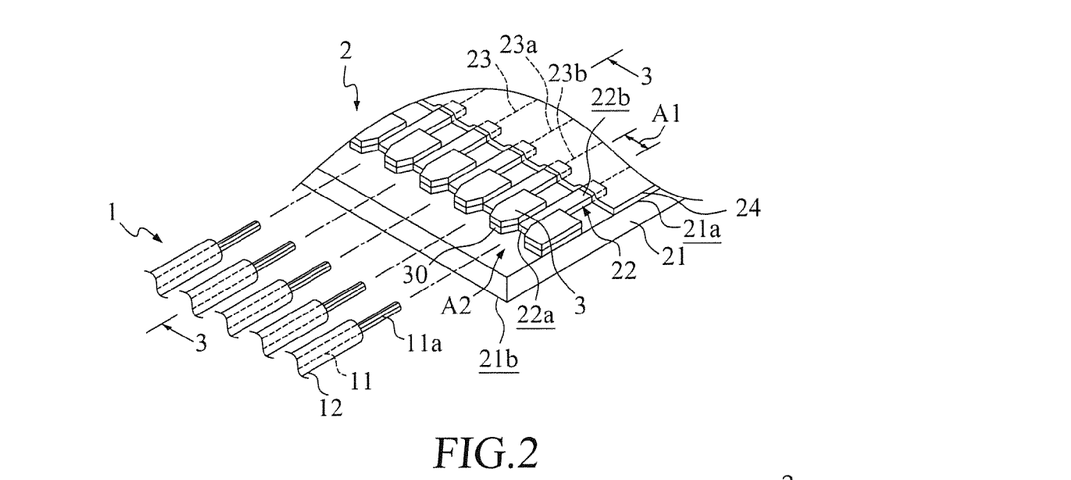
FIG. 2 is a perspective view, in an enlarged form, of a portion of the flexible circuit board of the first embodiment of the present invention with elevation pads formed thereon.
Figure 3:
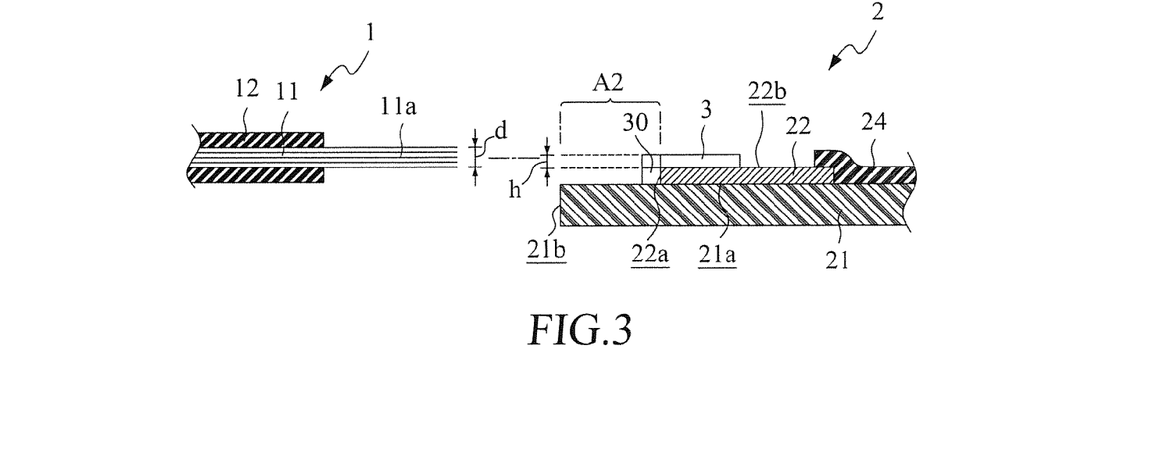
FIG. 3 is a cross-sectional view taken along line 3-3 of FIG. 2.

Referring to FIGS. 1-3, a first embodiment of the present invention is shown, wherein a conductor assembly 1 comprises a plurality of conductor lines 11 spaced from each other and exposed conductors 11a respectively extended from the conductor lines 11. The exposed conductors 11a can each be a single core or filament conductor line or a multiple core or filament conductor line. The conductor lines 11 are each enclosed by an insulator 12 for covering and insulation.

A flexible circuit board 2 comprises a substrate 21 and a plurality of contact pads 22 that is formed on a top surface 21a of a substrate 21 in a manner of being spaced from each other by spacing zones A1. The substrate 21 has a top surface 21a and a front edge 21b. The contact pads 22 each have a front end 22a and a top contact surface 22b. The front ends 22a of the contact pads 22 are spaced from the front edge 21b of the substrate 21 by a predetermined distance so that the front end 22a of the contact pads 22 and the front edge 21b of the substrate 21 define therebetween a supporting zone A2.

The top surface 21a of the substrate 21 comprises a plurality of signal lines 23 arranged thereon to respectively correspond to and electrically connect to the contact pads 22. The signal lines 23 comprise at least one pair of differential mode signal lines 23a, 23b for transmission of high frequency differential mode signals.

The top surface 21a of the flexible circuit board 2 further comprises an insulation cover layer 24 formed thereon to cover the top surface 21a and the signal lines 23 in such a way that at least a portion of the top contact surface 22b of each of the contact pads 22 exposed.

The flexible circuit board 2 is slit in a conductor line extension direction I to form a plurality of slit lines 25 and is then looped together by a looping member 26 to facilitate extension of the flexible circuit board 2 through a bore of a hinge or a narrow hole.

In a design of the present invention, a plurality of elevation pads 3 is arranged on the top surface 21a of the substrate 21. The plurality of elevation pads 3 is respectively set in the spacing zones A1 between the contact pads 22. The elevation pads 3 are bonded and thus fixed to the top surface 21a of the substrate 21 by an adhesive layer 30 (such as hot melt pressure sensitive adhesive). In a preferred embodiment, the elevation pads 3 are arranged to have a height h above the top contact surfaces 22b of the contact pads 22 (as shown in FIG. 3) and the height h of the elevation pads 3 is less than a diameter d of the exposed conductors 11a. Further, the spacing zone A1 between two adjacent contact pads 22 has a width that is less than 1.05 mm and the elevation pads 3 have a width that is made to adapt to the width of the spacing zones A1.

Figure 4:
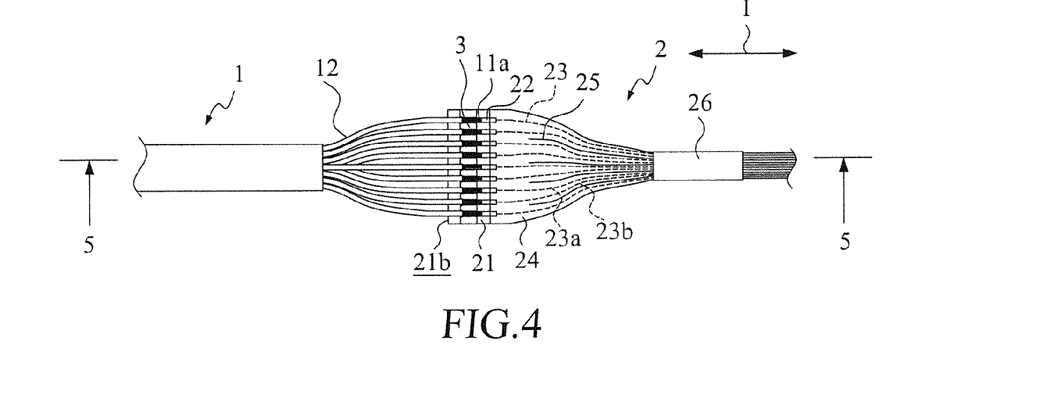
FIG. 4 is a schematic plan view showing the conductor assembly and the flexible circuit board of the first embodiment of the present invention in a condition of being connected.
Figure 5:
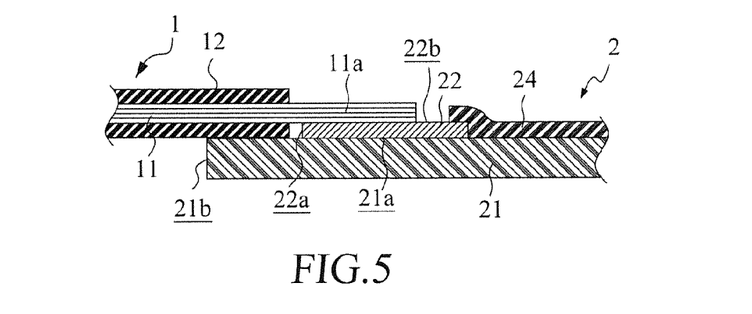
FIG. 5 is a cross-sectional view taken along line 5-5 of FIG. 4.
Figure 6:
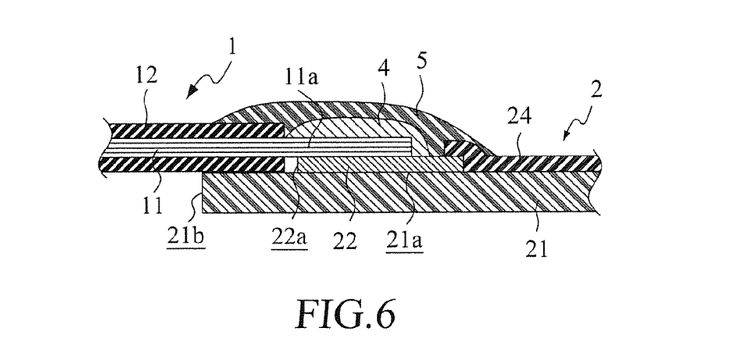
FIG. 6 is a cross-sectional view showing exposed conductors of the conductor assembly shown in FIG. 5 are fixed to contact pads by solder material and then covered by a protection layer.

Referring to FIGS. 4-6, to connect the conductor assembly 1 and the flexible circuit board 2 to each other, the exposed conductors 11a of the conductor assembly 1 are first separated from each other and lined up for being respectively inserted and deposited, in a one-by-one manner, on the contact pads 22 of the flexible circuit board 2 with the insulator 12 of the conductor assembly 1 positioned on and supported by the supporting zone A2 of the flexible circuit board 2. A solder material 4 is then applied to solder and fix each of the exposed conductors 11a in position on the top contact surface 22b of the respective contact pad 22. During the insertion of the exposed conductors 11a, the elevation pads 3 provide a function of correcting the insertion direction of and guiding in the exposed conductors 11a so that the exposed conductors 11a are kept from contacting each other.

Since the height h of the elevation pads 3 is less than the diameter d of the exposed conductors 11a, during a process of heating, heat can be guaranteed to directly transmit to the solder material 4 and the exposed conductors 11a to provide an excellent quality of soldering between the exposed conductors 11a and the contact pads 22. Finally, protection layer 5 may be set on and covers the solder material 4 and a portion of the conductor assembly 1 to provide an effect of secure retention. The elevation pads 3 can be made of a material selected from one of polyimide (PI), polyethylene terephthalate (PET), and photo image coverlayer (PIC).

Figure 7:
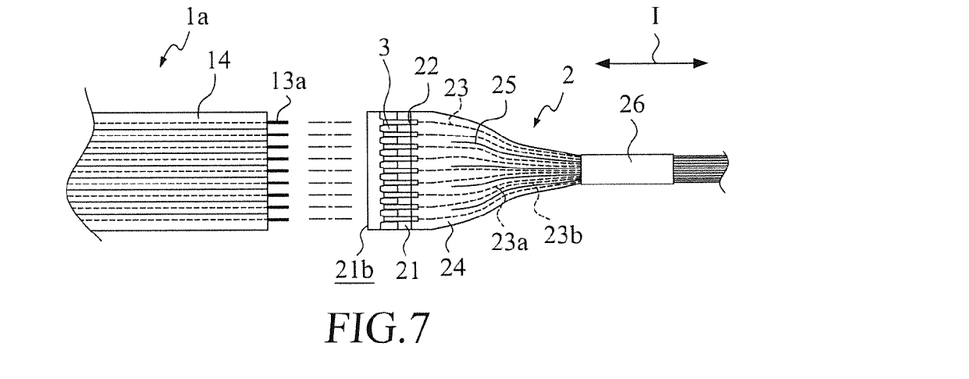
FIG. 7 is a schematic plan view showing a conductor assembly and a flexible circuit board of a second embodiment of the present invention in a condition of being not connected.
Figure 8:
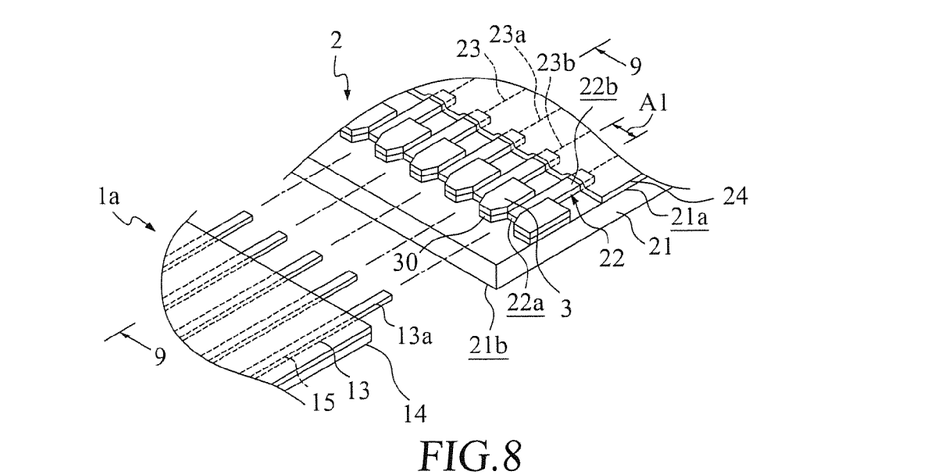
FIG. 8 is a perspective view, in an enlarged form, of a portion of the flexible circuit board of the second embodiment of the present invention with elevation pads formed thereon.
Figure 9:
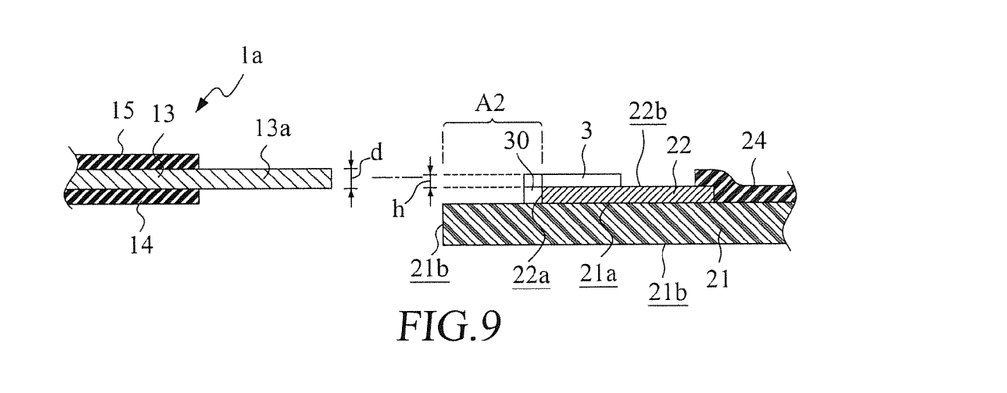
FIG. 9 is a cross-sectional view taken along line 9-9 of FIG. 8.

Referring to FIGS. 7-9, a second embodiment of the present invention is shown, wherein the conductor assembly may comprise a flexible flat cable (FFC) or a flexible circuit board (FPC). The instant embodiment provides a structure that is substantially similar to that of the first embodiment and thus, similar components/parts are designated with the same reference numerals for consistency. In the instant embodiment, the conductor assembly 1a similarly comprises a plurality of conductor lines 13 formed on a surface of a substrate 14 and an insulation layer 15 is set on and covers the surface of the substrate 14 and the plurality of conductor lines 13. The conductor assembly 1a similarly comprises a plurality of outward-extending exposed conductors 13a.

Figure 10:
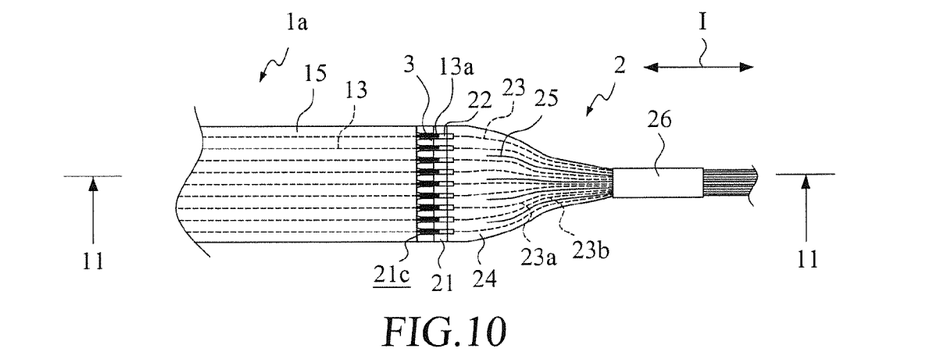
FIG. 10 is a schematic plan view showing the conductor assembly and the flexible circuit board of the second embodiment of the present invention in a condition of being connected.
Figure 11:
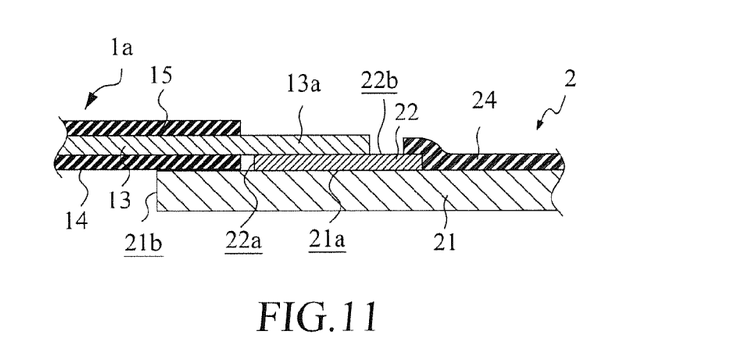
FIG. 11 is a cross-sectional view taken along line 11-11 of FIG. 10.
Figure 12:
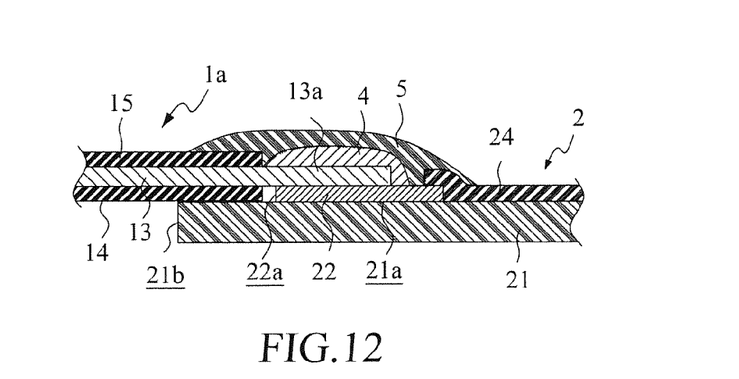
FIG. 12 is a cross-sectional view showing exposed conductors of the conductor assembly shown in FIG. 11 are fixed to contact pads by solder material and then covered by a protection layer.
Figure 13:
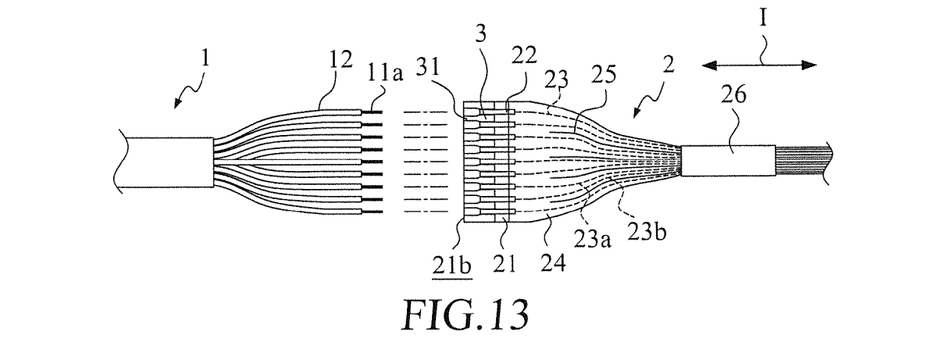
FIG. 13 is a schematic plan view showing a conductor assembly and a flexible circuit board of a third embodiment of the present invention in a condition of being not connected.
Figure 14:
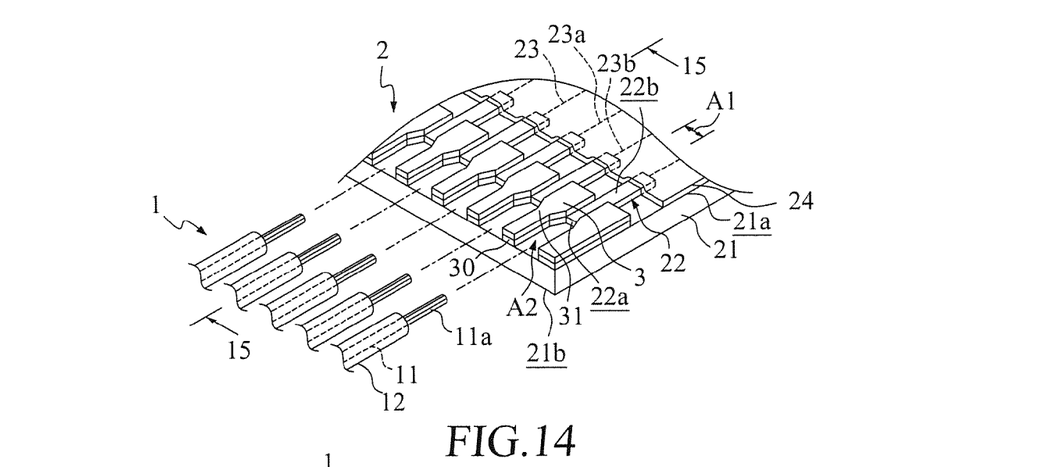
FIG. 14 is a perspective view, in an enlarged form, of a portion of the flexible circuit board of the third embodiment of the present invention with elevation pads formed thereon.
Figure 15:
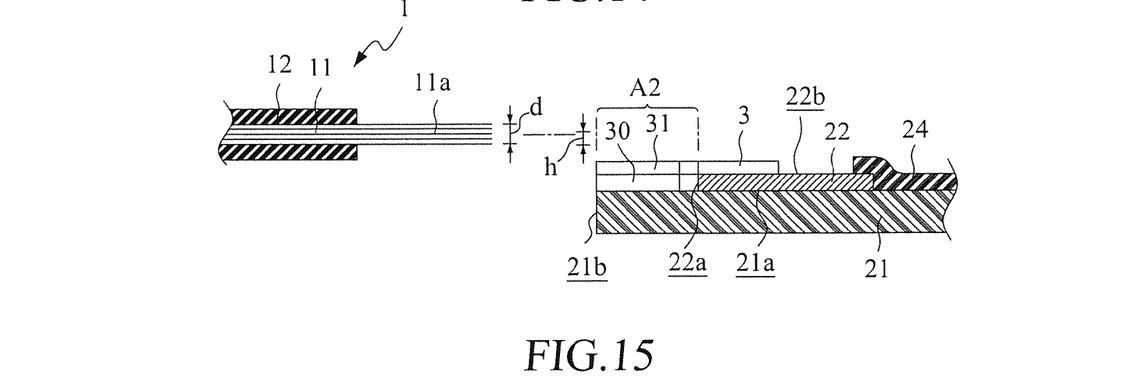
FIG. 15 is a cross-sectional view taken along line 15-15 of FIG. 14.
Figure 16:
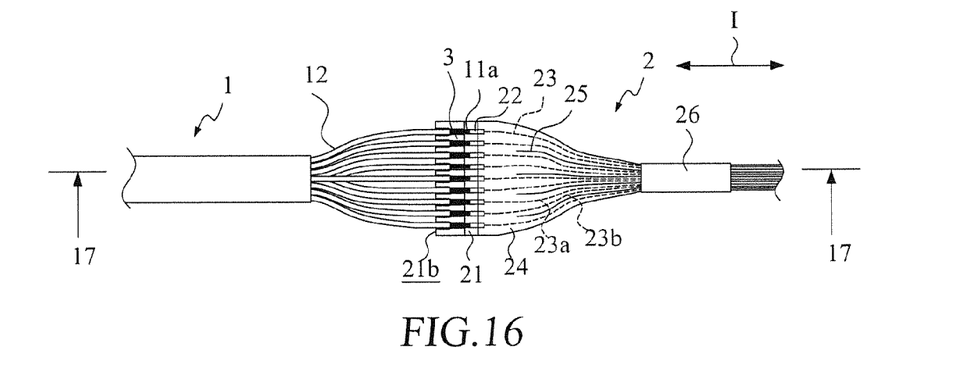
FIG. 16 is a schematic plan view showing the conductor assembly and the flexible circuit board of the third embodiment of the present invention in a condition of being connected.
Figure 17:
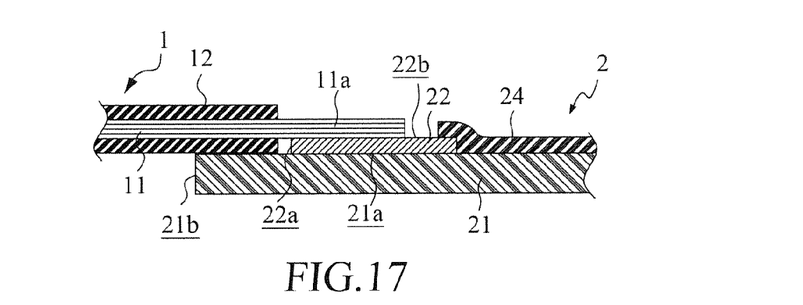
FIG. 17 is a cross-sectional view taken along line 17-17 of FIG. 16.
Figure 18:
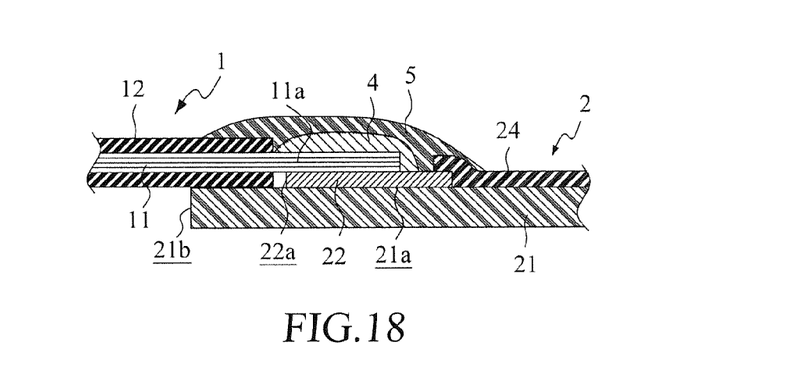
FIG. 18 is a cross-sectional view showing exposed conductors of the conductor assembly shown in FIG. 17 are fixed to contact pads by solder material and then covered by a protection layer.

Referring to FIGS. 10-12, to connect the conductor assembly 1a and the flexible circuit board 2 to each other, the exposed conductors 13a of the conductor assembly 1a are respectively inserted and deposited, in a one-by-one manner, on the contact pads 22 of the flexible circuit board 2 with a bottom surface of the substrate 14 positioned on and supported by the supporting zone A2 of the flexible circuit board 2. A solder material 4 is then applied to solder and fix each of the exposed conductors 13a in position on the top contact surface 22b of the respective contact pad 22. During the insertion of the exposed conductors 13a, the elevation pads 3 provide a function of correcting the insertion direction of and guiding in the exposed conductors 13a so that the exposed conductors 13a are kept from contacting each other.

Referring to FIGS. 13-18, a structural arrangement according a third embodiment of the present invention is shown. The structure of the instant embodiment is substantially similar to that of the first embodiment and thus, similar components/parts are designated with the same reference numerals for consistency. In the instant embodiment, the elevation pads 3 are each extended in a direction toward and into the supporting zone A2 (namely in a direction toward the front edge 21b of the substrate 21) to each form an extension section 31.

To connect the conductor assembly 1 and the flexible circuit board 2 to each other, the exposed conductors 11a of the conductor assembly 1 are respectively set in contact with the contact pads 22 in a one-to-one manner so that the insulators 12 of the conductor lines 11 of the conductor assembly 1 are respectively positioned on and supported by the supporting zone A2 of the flexible circuit board 2 and respectively located between adjacent ones of the extension sections 31. Under such a condition, a solder material 4 is applied to solder and fix each of the exposed conductors 11a in position on the top contact surface 22b of the respective contact pad 22. Finally, protection layer 5 are set on and cover the solder material 4 and a portion of the conductor assembly 1.

Figure 19:
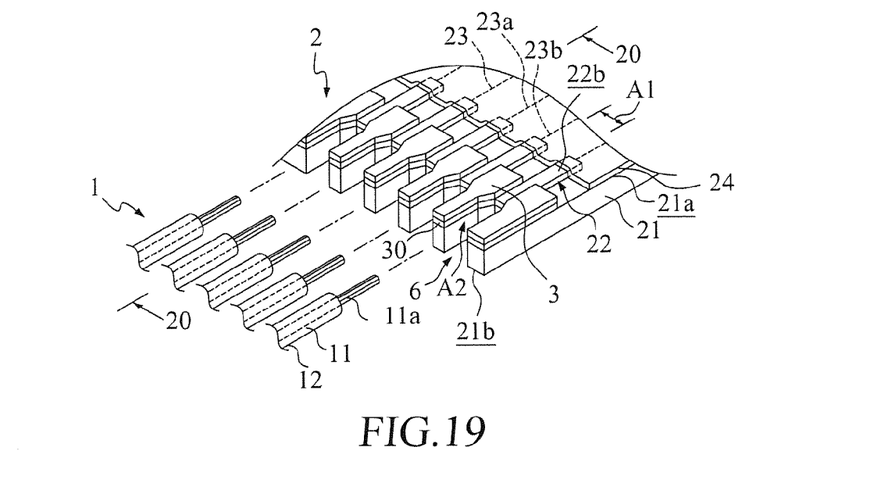
FIG. 19 is a perspective view, in an enlarged form, of a portion of the flexible circuit board of the fourth embodiment of the present invention with elevation pads formed thereon.

Referring to FIG. 19, a structural arrangement according a fourth embodiment of the present invention is shown. The structure of the instant embodiment is substantially similar to that of the embodiment of FIG. 14 and the difference is that the substrate 21 comprises a plurality of excavated portions 6 formed in the supporting zone A2 to respectively correspond to the contact pads 22.

Figure 20:
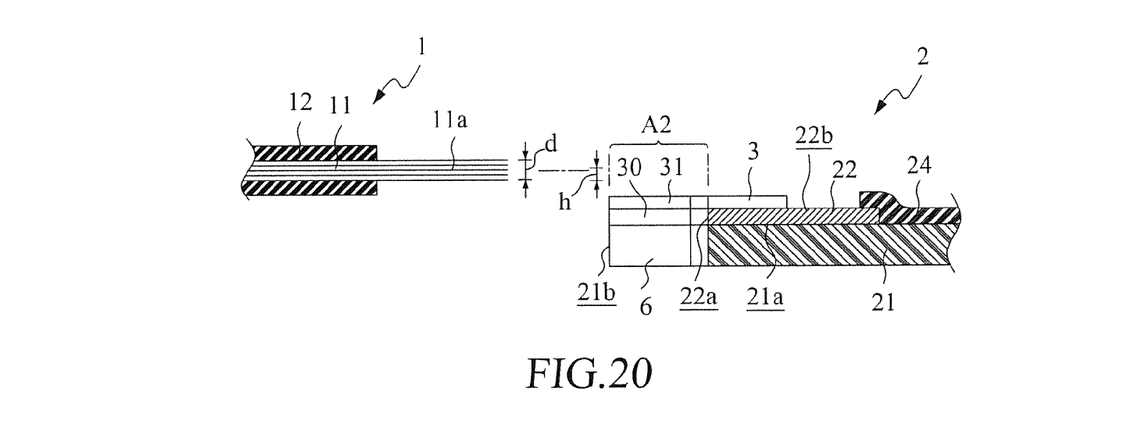
FIG. 20 is a cross-sectional view taken along line 20-20 of FIG. 19.
Figure 21:
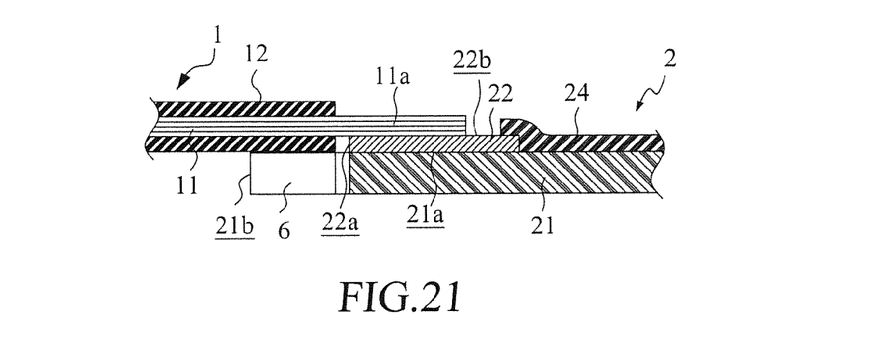
FIG. 21 is a cross-sectional view showing the conductor assembly and the flexible circuit board of FIG. 20 in a condition of being connected.
Figure 22:
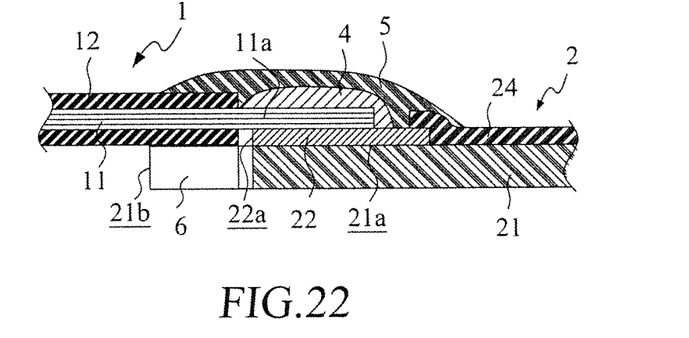
FIG. 22 is a cross-sectional view showing exposed conductors of the conductor assembly shown in FIG. 21 are fixed to contact pads by solder material and then covered by a protection layer.

As shown in FIGS. 20-22, to connect the conductor assembly 1 and the flexible circuit board 2 to each other, the exposed conductors 11a of the conductor assembly 1 are respectively set in contact with the contact pads 22 in a one-to-one manner, and under such a condition, the insulators 12 of the conductor lines 11 of the conductor assembly 1 are respectively received and located between adjacent ones of the extension sections 31 and in the excavated portions 6.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A contact pad connection structure comprising:
a conductor assembly connected to a flexible circuit board;
the conductor assembly including a plurality of conductor lines spaced from each other, each of the conductor lines having an exposed conductor extended therefrom;
the flexible circuit board including a substrate and a plurality of contact pads formed on a top surface of the substrate and spaced from each other by spacing zones defined between the contact pads;
wherein the top surface of the substrate includes a plurality of elevation pads respectively set in the spacing zones in such a way that each of the elevation pads has a height above a top contact surface of the contact pads;
wherein the exposed conductors of the conductor assembly are respectively set in contact with the top contact surfaces of the contact pads and a solder material is applied to solder and fix the exposed conductors respectively in position on the top contact surfaces of the contact pads; and
wherein the flexible circuit board further includes an insulation cover layer covering the top surface of the substrate thereof and the conductor lines of the conductor assembly with at least a portion of the top contact surfaces of the contact pads exposed.

2. The contact pad connection structure as claimed in claim 1, wherein the exposed conductors are each one of a single core conductor and a multiple core conductor.

3. The contact pad connection structure as claimed in claim 1, wherein a protection layer further covers the solder material and at least a portion of the conductor assembly.

4. The contact pad connection structure as claimed in claim 1, wherein the top surface of the substrate includes a plurality of signal lines electrically connected to the contact pads and the signal lines include at least one pair of differential mode signal lines for transmission of high frequency differential mode signals.

5. The contact pad connection structure of the conductor assembly and the flexible circuit board as claimed in claim 1, wherein each of the conductor lines is enclosed by an insulator.

6. The contact pad connection structure as claimed in claim 1, wherein the plurality of conductor lines are formed on a conductor substrate of the conductor assembly, and an insulation layer of the conductor assembly covers the conductor substrate and the plurality of conductor lines.

7. The contact pad connection structure as claimed in claim 1, wherein each of the contact pads has a front end that is spaced from a front edge of the substrate by a distance so that a supporting zone is defined between the front end of the contact pad and the front edge of the substrate; and each of the elevation pads includes an extension section extending in a direction toward the supporting zone.

8. The contact pad connection structure as claimed in claim 7, wherein the substrate is formed with a plurality of excavated portions in the supporting zone to respectively correspond to the contact pads.

9. The contact pad connection structure as claimed in claim 1, wherein the height of the elevation pads is less than a diameter of the exposed conductors.

10. The contact pad connection structure as claimed in claim 1, wherein each of the spacing zones has a width less than 1.05 mm.

11. The contact pad connection structure as claimed in claim 1, wherein the elevation pads are bonded and fixed to the top surface of the substrate by an adhesive layer.

12. The contact pad connection structure as claimed in claim 1, wherein the elevation pads are made of a material selected from one of polyimide (PI), polyethylene terephthalate (PET), and photo image coverlayer (PIC).

13. A contact pad connection structure comprising:
a conductor assembly connected to a flexible circuit board;
the conductor assembly including a plurality of conductor lines spaced from each other, each of the conductor lines having an exposed conductor extended therefrom;
the flexible circuit board including a substrate and a plurality of contact pads formed on a top surface of the substrate and spaced from each other by spacing zones defined between the contact pads;
wherein the top surface of the substrate includes a plurality of elevation pads respectively set in the spacing zones in such a way that each of the elevation pads has a height above a top contact surface of the contact pads;

wherein the exposed conductors of the conductor assembly are respectively set in contact with the top contact surfaces of the contact pads and a solder material is applied to solder and fix the exposed conductors respectively in position on the top contact surfaces of the contact pads; and wherein the plurality of conductor lines are formed on a conductor substrate of the conductor assembly, and an insulation layer of the conductor assembly is set on and covers the conductor substrate and the plurality of conductor lines.

14. A contact pad connection structure comprising:

a conductor assembly connected to a flexible circuit board;

the conductor assembly including a plurality of conductor lines spaced from each other, each of the conductor lines having an exposed conductor extended therefrom;

the flexible circuit board including a substrate and a plurality of contact pads formed on a top surface of the substrate and spaced from each other by spacing zones defined between the contact pads;

wherein the top surface of the substrate includes a plurality of elevation pads respectively set in the spacing zones in such a way that each of the elevation pads has a height above a top contact surface of the contact pads;

wherein the exposed conductors of the conductor assembly are respectively set in contact with the top contact surfaces of the contact pads and a solder material is applied to solder and fix the exposed conductors respectively in position on the top contact surfaces of the contact pads;

wherein each of the contact pads has a front end that is spaced from a front edge of the substrate by a distance so that a supporting zone is defined between the front end of the contact pad and the front edge of the substrate; each of the elevation pads including an extension section extending in a direction toward the supporting zone; and wherein the substrate of the flexible circuit board is formed with a plurality of excavated portions in the supporting zone to respectively correspond to the contact pads.

* * * * *